(12) United States Patent
Li

(10) Patent No.: US 9,806,707 B2
(45) Date of Patent: Oct. 31, 2017

(54) POWER DISTRIBUTION NETWORK (PDN) CONDITIONER

(71) Applicant: QUALCOMM Incorporated, San Diego, CA (US)

(72) Inventor: Qing Li, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 652 days.

(21) Appl. No.: 14/175,922

(22) Filed: Feb. 7, 2014

(65) Prior Publication Data

US 2015/0229303 A1    Aug. 13, 2015

(51) Int. Cl.
| | |
|---|---|
| *H02M 1/15* | (2006.01) |
| *H02J 1/02* | (2006.01) |
| *H03K 17/14* | (2006.01) |
| *H03K 3/012* | (2006.01) |
| *G11C 5/06* | (2006.01) |
| *G11C 5/14* | (2006.01) |

(52) U.S. Cl.
CPC .......... *H03K 17/145* (2013.01); *G11C 5/063* (2013.01); *H02J 1/02* (2013.01); *H02M 1/15* (2013.01); *H03K 3/012* (2013.01); *G11C 5/14* (2013.01); *Y10T 307/858* (2015.04)

(58) Field of Classification Search
None
See application file for complete search history.

(56) References Cited

U.S. PATENT DOCUMENTS

| | | | |
|---|---|---|---|
| 6,304,131 | B1 | 10/2001 | Huggins et al. |
| 6,661,211 | B1 | 12/2003 | Currelly et al. |
| 6,894,553 | B2 | 5/2005 | Hulfachor et al. |
| 7,157,924 | B2 | 1/2007 | Muhtaroglu et al. |
| 7,304,462 | B2 | 12/2007 | Shvarts |

(Continued)

FOREIGN PATENT DOCUMENTS

| | | |
|---|---|---|
| CN | 201867672 U | 6/2011 |
| EP | 1903666 A1 | 3/2008 |

(Continued)

OTHER PUBLICATIONS

Li Y., et al., "High Efficiency Wide Bandwidth Power Supplies for GSM and EDGE RF Power Amplifiers", Conference Proceedings/IEEE International Symposium on Circuits and Systems (ISCAS): May 23-26, 2005, International Conference Center, Kobe, Japan, IEEE Service Center, Piscataway, NJ, May 23, 2005 (May 23, 2005), pp. 1314-1317, XP010815779.

(Continued)

*Primary Examiner* — Rexford Barnie
*Assistant Examiner* — Swarna N Chowdhuri
(74) *Attorney, Agent, or Firm* — Loza & Loza, LLP/Qualcomm

(57) ABSTRACT

Systems and methods for conditioning a power rail (e.g., reducing voltage droops and/or voltage overshoots on the power rail) are described herein. In one embodiment, a power circuit comprises a capacitor coupled to a high-voltage rail, and a droop slope limiter (DSL) coupled between the high-voltage rail and a power rail. The DSL is configured to detect a downward voltage slope on the power rail, and to control current flow from the high-voltage rail to the power rail through the DSL based on the detected downward voltage slope.

28 Claims, 10 Drawing Sheets

(56) References Cited

U.S. PATENT DOCUMENTS

| | | |
|---|---|---|
| 7,839,129 B2 | 11/2010 | Pant et al. |
| 8,026,636 B2 | 9/2011 | Oh |
| 2003/0085754 A1* | 5/2003 | Lim .................. G05F 1/465 327/540 |
| 2009/0135628 A1* | 5/2009 | Ye ................. H02M 7/2176 363/21.04 |
| 2009/0174262 A1* | 7/2009 | Martin ................ H02M 3/157 307/82 |
| 2009/0302683 A1 | 12/2009 | Wu et al. |
| 2012/0068542 A1 | 3/2012 | Alappat |
| 2013/0021094 A1 | 1/2013 | Bhattacharyya et al. |
| 2013/0162233 A1 | 6/2013 | Marty |
| 2013/0320942 A1 | 12/2013 | Vemula |
| 2013/0328536 A1 | 12/2013 | Ueno et al. |
| 2015/0220096 A1 | 8/2015 | Luff |
| 2015/0286232 A1 | 10/2015 | Parikh |
| 2016/0179181 A1 | 6/2016 | Doyle |

FOREIGN PATENT DOCUMENTS

| | | |
|---|---|---|
| EP | 2477459 A1 | 7/2012 |
| WO | WO-9903028 A1 | 1/1999 |
| WO | WO-2005038920 A2 | 4/2005 |
| WO | WO-2010131104 A2 | 11/2010 |
| WO | WO-2012036668 A1 | 3/2012 |
| WO | WO-2013098246 A1 | 7/2013 |
| WO | WO-2014006440 A1 | 1/2014 |

OTHER PUBLICATIONS

International Preliminary Report on Patentability—PCT/US2015/061630, The International Bureau of WIPO—Geneva, Switzerland, dated Mar. 21, 2017 (140675WO).

International Search Report and Written Opinion—PCT/US2015/014313—ISA/EPO—May 15, 2015 (134264WO).

Lee K., et al., "Analysis and Design of Adaptive Bus Voltage Positioning System for Two-Stage Voltage Regulators", IEEETransactions on Power Electronics, Institute of Electrical and Electronics Engineers,USA, vol. 24, No. 12, Dec. 1, 2009 (Dec. 1, 2009), pp. 2735-2745,XP011282604, ISSN: 0885-8993, DOI: 10.1109/TPEL.2009.2030806 Sections 11,111; figures 4,5.

Lee Y.H., et al., "A Low Quiescent Current Asynchronous Digital-LDO With PLL-Modulated Fast-DVS Power Management in 40 nm SoC for MIPS Performance Improvement", IEEE Journal of Solid-State Circuits, IEEE Service Center,Piscataway, NJ, USA, vol. 48, No. 4, Apr. 1, 2013 (Apr. 1, 2013), pp. 1018-1030, XP011497974, ISSN: 0018-9200, DOI: 10.1109/JSSC.2013.2237991 Sections I, II; figures 1,3b,4,5.

* cited by examiner

POWER DISTRIBUTION NETWORK (PDN) CONDITIONER

BACKGROUND

Field

Aspects of the present disclosure relate generally to power distribution networks, and more particularly, to power distribution network (PDN) conditioners.

Background

A power distribution network (PDN) is used to distribute power to various circuits in a system on a chip (SoC) from an off-chip power source (e.g., power management integrated circuit (PMIC)). The PDN may employ power gating to conserve power, in which the PDN selectively connects circuits in the SoC that are active to the power source and disconnects circuits in the SoC that are inactive from the power source. The PDN typically has a large inductance in the lead connecting the SoC to the off-chip power source (e.g., PMIC). The inductance induces a ripple on the power rail when the load on the power rail suddenly changes (e.g., due to power gating).

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a power circuit is described herein. The power circuit comprises a capacitor coupled to a high-voltage rail, and a droop slope limiter (DSL) coupled between the high-voltage rail and a power rail. The DSL is configured to detect a downward voltage slope on the power rail, and to control current flow from the high-voltage rail to the power rail through the DSL based on the detected downward voltage slope.

A second aspect relates to a method for conditioning a power rail. The method comprises detecting a downward voltage slope on the power rail, and controlling current flow from a high-voltage rail to the power rail based on the detected downward voltage slope, wherein a capacitor is coupled to the high-voltage rail.

A third aspect relates to an apparatus for conditioning a power rail. The apparatus comprises means for detecting a downward voltage slope on the power rail, and means for controlling current flow from a high-voltage rail to the power rail based on the detected downward voltage slope, wherein a capacitor is coupled to the high-voltage rail.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A power distribution network (PDN) is used to distribute power to various circuits in a system on a chip (SoC) from an off-chip power source (e.g., power management integrated circuit (PMIC)). The PDN may employ power gating to conserve power, in which the PDN selectively connects circuits in the SoC that are active to the power source and disconnects circuits in the SoC that are inactive from the power source. This prevents power leakage from circuits that are inactive (e.g., idle), thereby conserving power.

The PDN typically has a large inductance in the lead connecting the SoC to the off-chip power source (e.g., PMIC). For example, the inductance may include board inductance, package inductance, etc. The inductance induces a ripple on the power rail when the load on the power rail suddenly changes (e.g., due to power gating). As the voltage on the power rail decreases (e.g., below 0.9V) and the load of the SoC increases (e.g., due to higher integration), the ripple effect becomes so severe that it greatly affects the operation of digital circuits coupled to the power rail. For example, the ripple effect may cause logic errors in the SoC and/or memory cells to flip states in the SoC. Accordingly, it is desirable to reduce the ripple effect.

One approach to reduce the ripple effect is to directly connect an on-chip decoupling capacitor to the power rail. However, fabricating a large on-chip capacitor is very expensive. Further, only a small portion of the capacitor's charge storage capacity can be used to reduce the ripple effect. This can be demonstrated with reference to FIG. 1.

Figure 1:
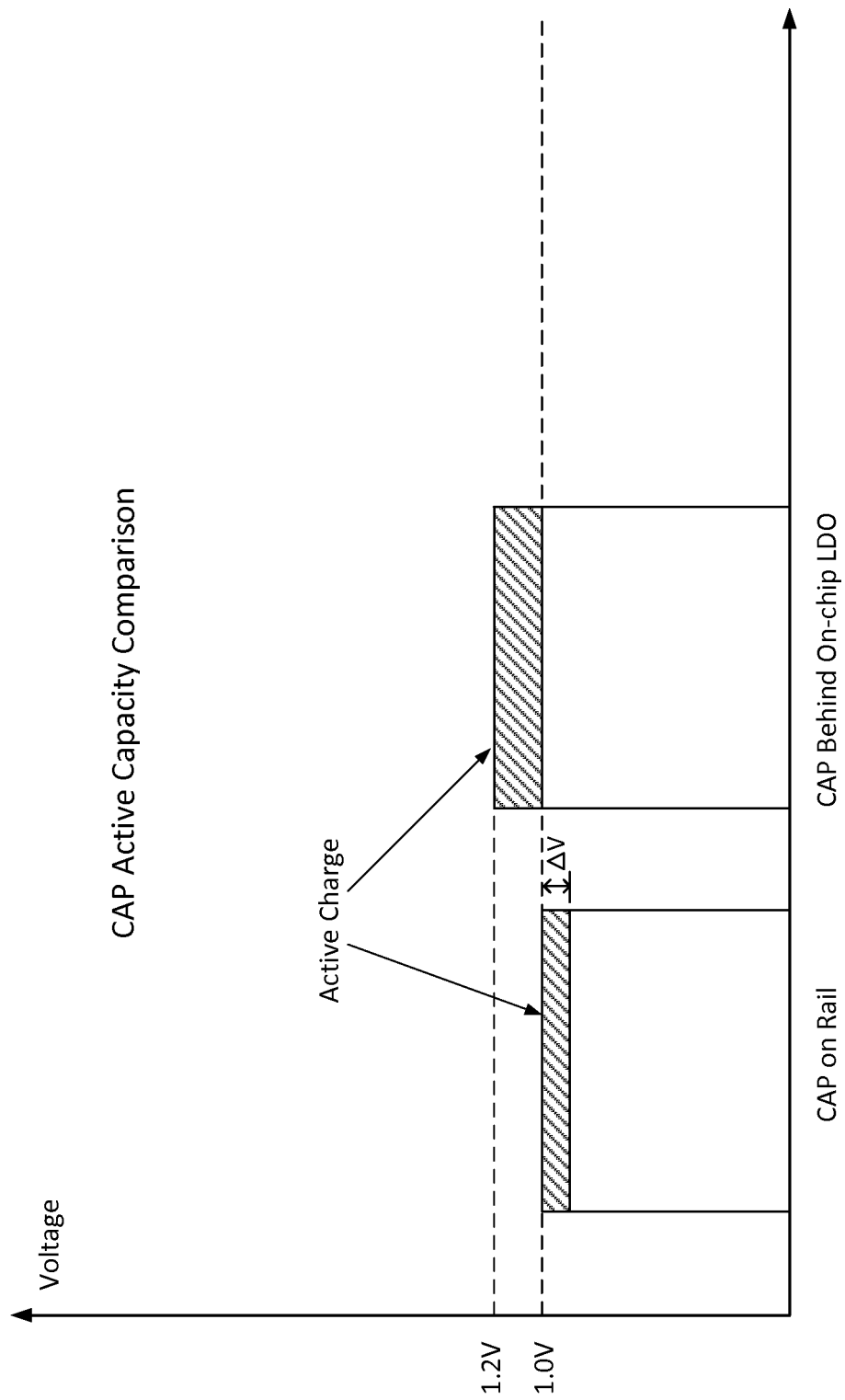
FIG. 1 shows an example of active charge for a decoupling capacitor placed directly on a rail and active charge for a decoupling capacitor placed behind a low-dropout regulator (LDO) coupled to the rail.

In the example in FIG. 1, the supply voltage on the power rail is approximately 1.0V, and the maximum voltage droop on the power rail that can be tolerated is approximately ΔV, which is much smaller than 1.0V (e.g., 0.1V or less). The total charge stored on the decoupling capacitor (denoted CAP in FIG. 1) is approximately equal to C·V, where C is the capacitance of the capacitor and V is the supply voltage (e.g., 1.0V in FIG. 1). However, only a small portion of this charge approximately equal to C·ΔV (referred to as active charge) is available to reduce the ripple effect on the power rail. In other words, only a small portion of the capacitor's charge storage capacity (referred to as active capacity) is available to reduce the ripple effect. As shown in FIG. 1, the active charge (shaded region) makes up only a small portion of the total charge stored on the decoupling capacitor.

Another approach to reduce the ripple effect is to place the on-chip decoupling capacitor behind an on-chip low-dropout regulator (LDO) coupled to the power rail. In this approach, the decoupling capacitor is connected to a higher voltage (e.g., 1.2V) and supplies charge to the power rail through the LDO to reduce the ripple effect. The active charge is larger in this approach compared with the previous approach (as shown in FIG. 1), but not by much due to energy loss in the LDO.

Embodiments of the present disclosure substantially increase the active capacity of a capacitor for reducing the ripple effect compared with the previous two approaches, as discussed further below.

Figure 2:
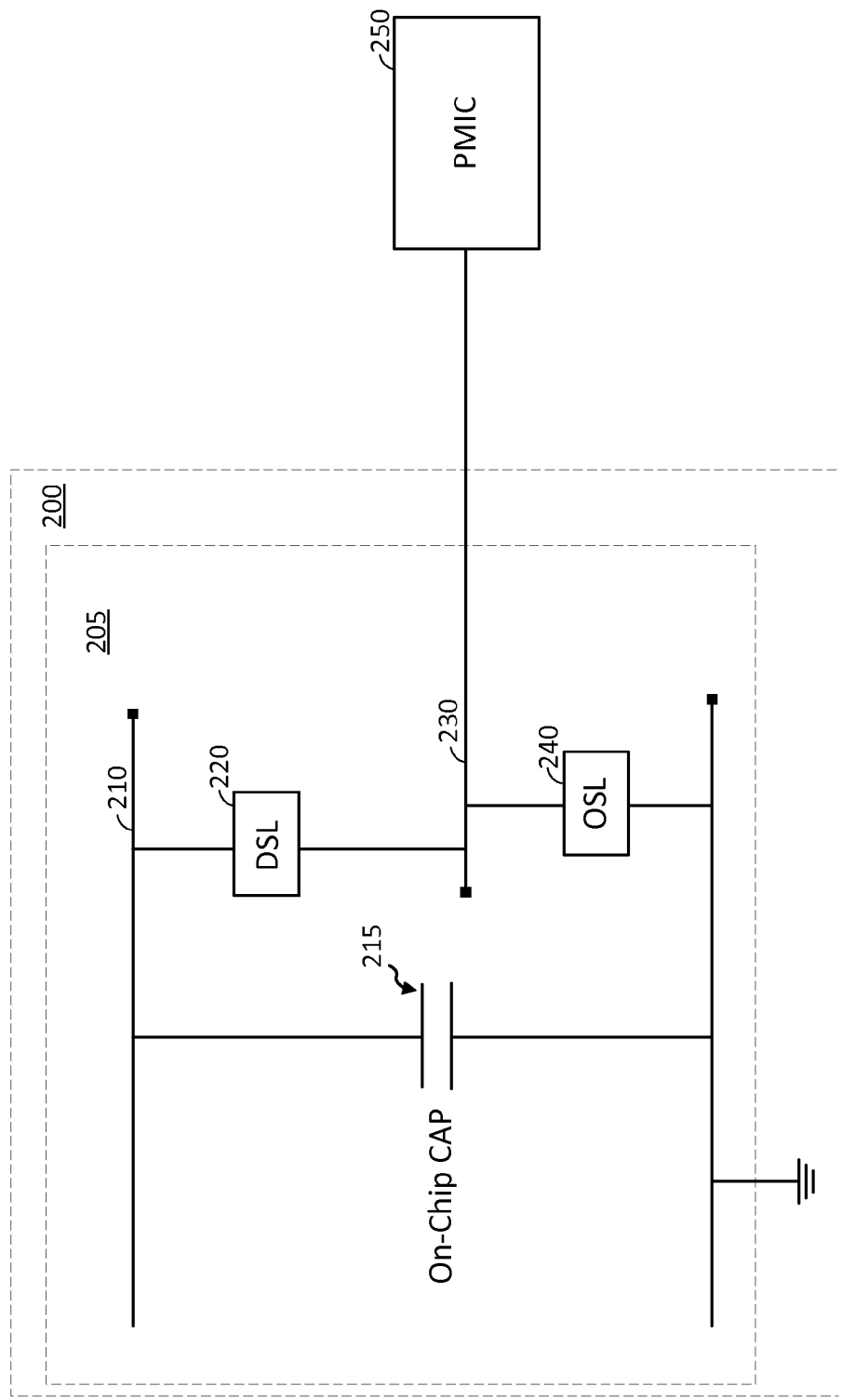
FIG. 2 is a block diagram of a power distribution network (PDN) conditioner according to an embodiment of the present disclosure.

FIG. 2 shows a PDN conditioner 205 according to an embodiment of the present disclosure. The PDN conditioner 205 may be integrated on a chip 200 with a power rail 230 connected to an off-chip PMIC 250 for supplying power from the PMIC 250 to various circuits (not shown in FIG. 2) on the chip. The lead connecting the PMIC 250 to the power rail 230 may include inductance (e.g., board and/or package inductance) that produces a ripple on the power rail 230 when the load on the power rail changes (e.g., due to power gating).

The PDN conditioner 205 comprises an on-chip capacitor 215 coupled between a high-voltage rail 210 and ground. The high-voltage rail 210 has a higher voltage than the power rail 230 used to supply power to the various circuits (not shown in FIG. 2) on the chip from the PMIC 250. For example, the high-voltage rail 210 may have a nominal voltage of approximately 2.4V while the power rail 230 may have a supply voltage of approximately 1.0V. In general, the high-voltage rail 210 may have a voltage that is at least 50% higher than the supply voltage of the power rail 230. The PDN conditioner 205 also comprises a droop slope limiter (DSL) 220 coupled between the high-voltage rail 210 and the power rail 230, and an overshoot slope limiter (OSL) 240 coupled between the power rail 230 and ground. The DSL 220 and OSL 240 are discussed in greater detail below.

Figure 3:
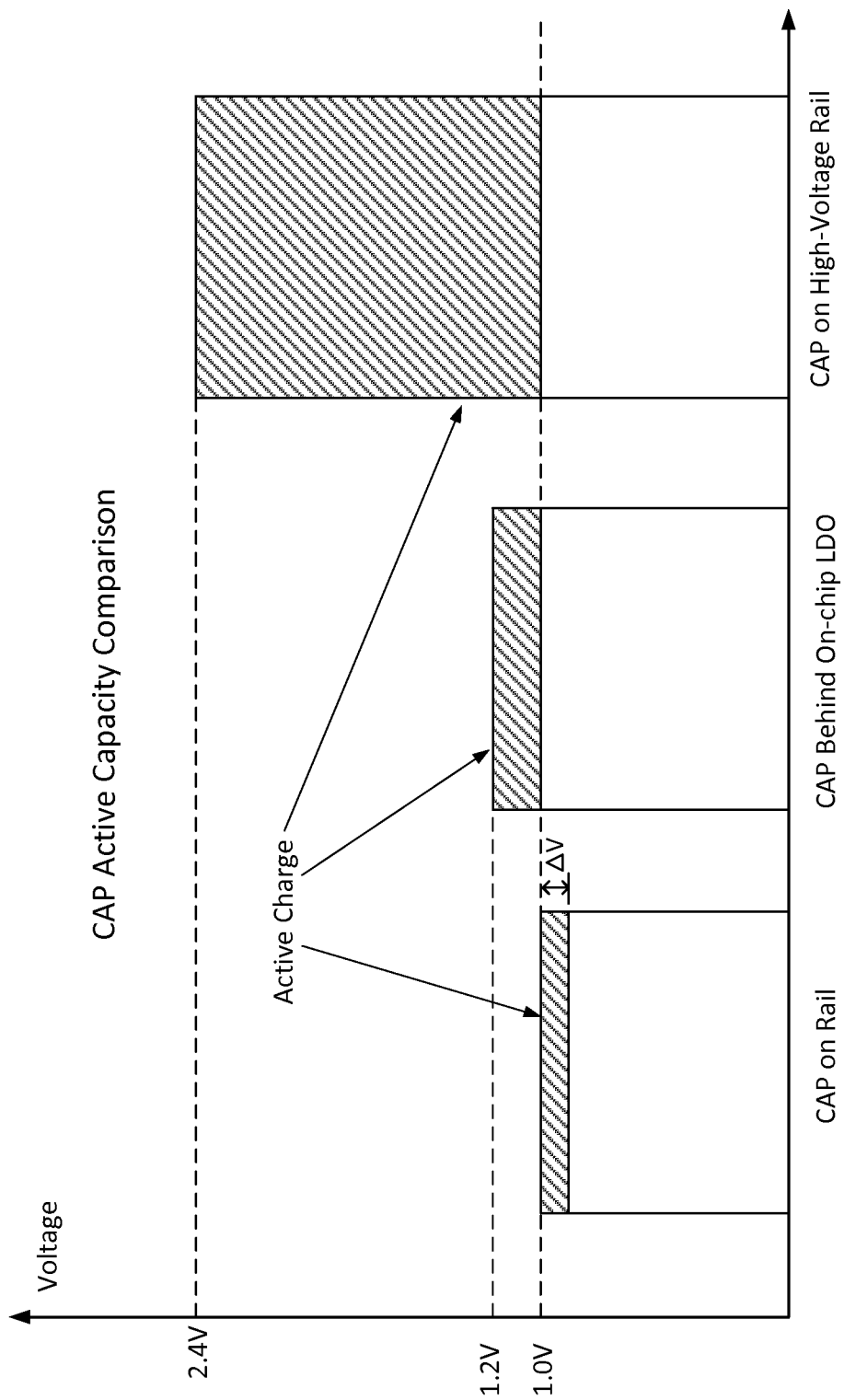
FIG. 3 shows an example of active charge for a capacitor coupled to a high-voltage rail according to an embodiment of the present disclosure.

The active charge of the on-chip capacitor 215 is much larger (e.g., 5~10× higher) compared with the previous two approaches discussed above. This is because the on-chip capacitor 215 is connected to the high-voltage rail 210, and the active charge is proportional to the voltage difference between the high-voltage rail 210 and the power rail 230, which is relatively large. This can be demonstrated with reference to FIG. 3, which shows an example of the active charge for the on-chip capacitor 215 compared with the previous two approaches shown in FIG. 1. As shown in FIG. 3, the active charge (shaded region) of the on-chip capacitor 215 is significantly larger than the active charge for the capacitors in the previous two approaches for a given capacitor size. Because the capacitor 215 has a much larger active charge, the capacitor 215 is able to supply significantly more charge to reduce ripple on the power rail 230.

Referring back to FIG. 2, the DSL 220 is configured to control the flow of current from the capacitor 215 to the power rail 230 based on a downward (negative) voltage slope on the power rail 230. More particularly, the DSL 220 is configured to detect a downward voltage slope on the power rail 230, and to turn on/off based on the detected downward voltage slope. When the DSL 220 is turned on, the DSL 220 allows current to flow from the capacitor 215 to the power rail 230 through the DSL 220, and when the DSL 220 is turned off, the DSL 220 blocks current flow from the capacitor 215 to the power rail 230.

In one embodiment, the DSL 220 is configured to turn off if the magnitude (absolute value) of a detected downward voltage slope is below a slope threshold or no downward voltage slope is detected. The DSL 220 is configured to turn on if the magnitude of a detected downward voltage slope exceeds (crosses) the slope threshold. As a result, the DSL 220 allows current to flow from the capacitor 215 to the power rail 230 when a ripple on the power rail 230 produces a downward voltage slope on the power rail 230 having a magnitude that exceeds the slope threshold. The current from the capacitor 215 limits the downward voltage slope, thereby reducing the voltage droop of the ripple.

Figure 4:
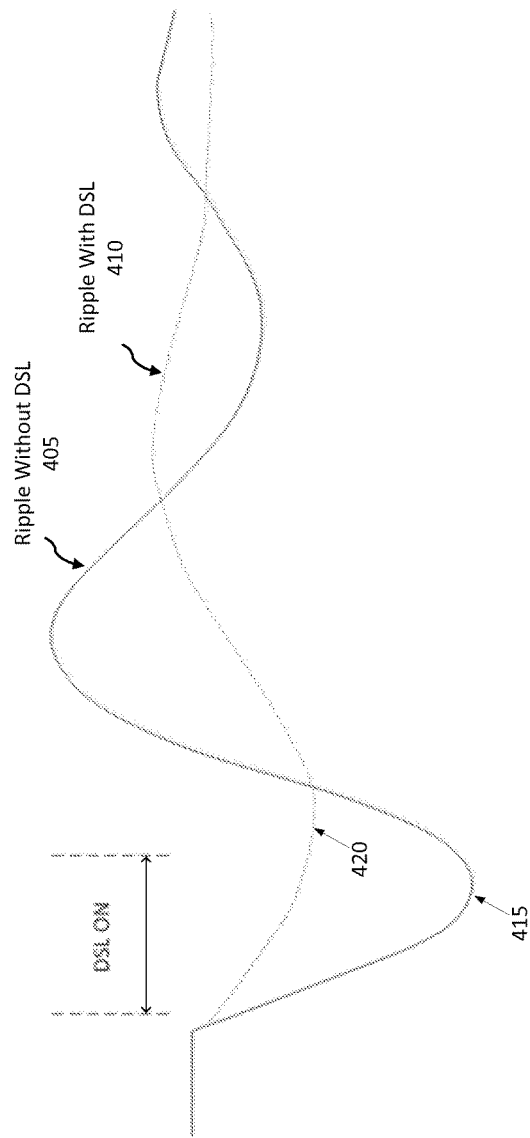
FIG. 4 shows an example of a ripple without a droop slope limiter (DSL) and a ripple with the DSL according to an embodiment of the present disclosure.

FIG. 4 shows a comparison of a ripple 405 without the DSL 220 and a ripple 410 with the DSL 220. As shown in FIG. 4, the ripple 405 without the DSL 220 has a relatively large voltage droop 415. The ripple 405 may be caused by an increase in the load coupled to power rail 230 (e.g., due to power gating). The ripple 405 dampens over time (e.g., due to resistance in the PDN), causing the amplitude of the ripple 405 to decrease over time. The ripple 410 with the DSL 220 has a much smaller voltage droop 420. This is because the DSL 220 turns on when the magnitude of a downward voltage slope crosses the slope threshold, allowing current to flow from the capacitor 215 to the power rail 230 through the DSL 220. The current from the capacitor 215 reduces the size of the voltage droop 420, thereby reducing the amplitude of the ripple 410.

When the DSL 220 turns on, the DSL 220 may control (regulate) the amount of current flow from the capacitor 215 to the power rail 230 such that the magnitude of the downward voltage slope on the power rail 230 is approximately limited to the slope threshold. When the magnitude of the downward voltage slope on the power rail 230 falls below the slope threshold, the DSL 220 may turn itself off. As a result, the DSL 220 may only turn on for a relatively short time duration (e.g., less than 100 ns) to reduce a ripple on the power rail 230. An example of this is shown in FIG. 4.

In the example in FIG. 4, the DSL 220 turns on when the magnitude of the downward voltage slope on the power rail 230 crosses the slope threshold, reducing the size of the voltage droop 420 on the power rail 230. The DSL 220 turns off when the magnitude of the downward voltage slope falls below the slope threshold, which may occur just before the bottom of the voltage droop 420 is reached, as shown in FIG. 4. During the time that the DSL 220 is turned on, the DSL 220 may control (regulate) the downward voltage slope to a value set by the slope threshold. By reducing the size of the voltage droop 420, the DSL 220 significantly reduces the amplitude of the ripple 410 compared to the ripple 405 without the DSL 220. Because the DSL 220 only turns on for a short time duration to reduce the ripple, the buck efficiency of the DSL 220 is not a problem, and therefore the DSL 220 can operate on the high-voltage rail 210.

The OSL 240 operates in a similar manner as the DSL 220 except that the OSL 240 controls the flow of current from the power rail 230 to ground based on an upward (positive) voltage slope on the power rail 230. More particularly, the OSL 240 is configured to detect an upward voltage slope on the power rail 230, and to turn on/off based on the detected upward voltage slope. When the OSL 240 is turned on, the OSL 240 allows current to flow from the power rail 230 to ground through the OSL 240, and when the OSL 240 is turned off, the OSL 240 blocks current flow from the power rail 230 to ground.

In one embodiment, the OSL 240 is configured to turn off if a detected upward slope is below a slope threshold or no upward voltage slope is detected. The OSL 240 is configured to turn on if a detected upward slope exceeds the slope threshold. As a result, the OSL 240 allows current to flow from the power rail 230 to ground when a ripple on the power rail 230 produces an upward voltage slope on the power rail 230 exceeding the slope threshold. The current flow to ground limits the upward voltage slope, thereby reducing the voltage overshoot of the ripple. The slope thresholds for the DSL 220 and the OSL 240 may be the same or different.

Figure 5:
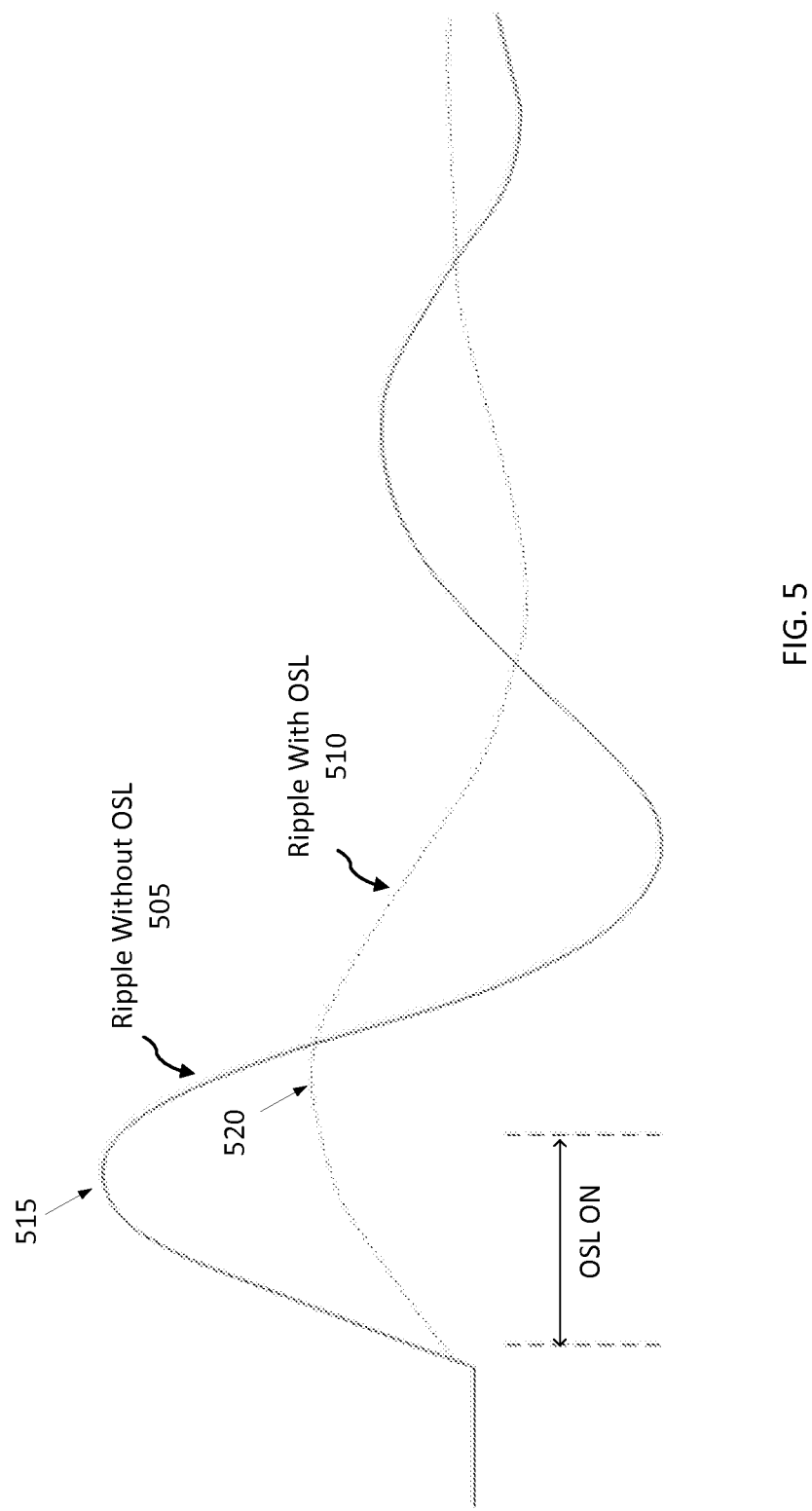
FIG. 5 shows an example of a ripple without an overshoot slope limiter (OSL) and a ripple with the OSL according to an embodiment of the present disclosure.

FIG. 5 shows a comparison of a ripple 505 without the OSL 240 and a ripple 510 with the OSL 240. As shown in FIG. 5, the ripple 505 without the OSL 240 has a relatively large voltage overshoot 515. The ripple 505 may be caused by a decrease in the load coupled to power rail 230 (e.g., due to power gating). The ripple 505 dampens over time (e.g., due to resistance in the PDN), causing the amplitude of the ripple to decrease over time. The ripple 510 with the OSL 240 has a much smaller overshoot 520. This is because the OSL 240 turns on when an upward voltage slope on the power rail 230 crosses the slope threshold, allowing current to flow from the power rail 230 to ground. The current flow to ground reduces the size of the overshoot 520, thereby reducing the amplitude of the ripple 510.

When the OSL 240 turns on, the OSL 240 may control (regulate) the amount of current flow from the power rail 230 to ground such that the upward voltage slope on the power rail 230 is approximately limited to the slope threshold. When the upward voltage slope on the power rail 230 falls below the slope threshold, the OSL 240 may turn itself off. As a result, the OSL 240 may only turn on for a relatively short time (less than 100 ns) to reduce a ripple. An example of this is shown in FIG. 5.

In the example in FIG. 5, the OSL 240 turns on when the upward voltage slope on the power rail 230 crosses the slope threshold, reducing the size the overshoot 520. The OSL 240 turns off when the upward voltage slope falls below the slope threshold, which may occur just before the top of the overshoot 520 is reached, as shown in FIG. 5. During the time that the OSL 240 is turned on, the OSL 240 may control (regulate) the upward voltage slope to a value set by the slope threshold. By reducing the size of the overshoot 520, the OSL 240 significantly reduces the amplitude of the ripple 510 compared to the ripple 505 without the OSL 240.

Figure 6:
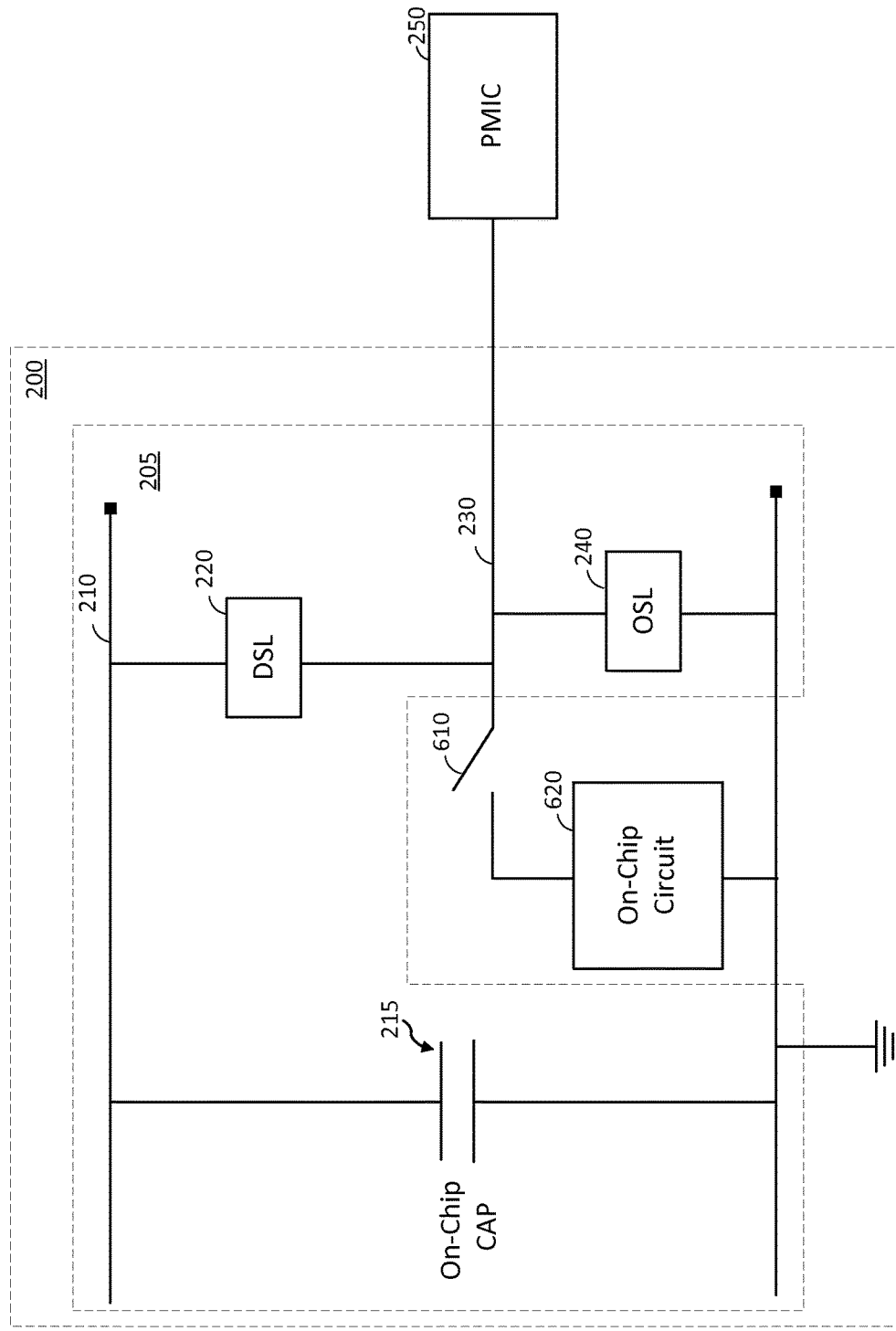
FIG. 6 shows an example in which the PDN conditioner sources inrush current to an on-chip circuit according to an embodiment of the present disclosure.

FIG. 6 shows an example in which the chip 200 comprises a circuit 620 that receives power from the power rail 230 through a power-gating switch 610 (e.g., head switch). A power management circuit (not shown) may connect the circuit 620 to the power rail 230 when the circuit 620 is active by turning on the power-gating switch 610. The power management circuit may disconnect the circuit 620 from the power rail 230 when the circuit 620 is inactive (e.g., idle) by turning off the power-gating switch 610. Although one circuit 620 is shown in FIG. 6 for ease of illustration, it is to be appreciated that the chip 200 may comprise a plurality of circuits, in which each circuit may be selectively connected to the power rail 230 by a separate power-gating switch. This allows the circuits to be power gated independently.

When the power-gating switch 610 disconnects the circuit 620 from the power rail 230, capacitors in the circuit 620 are discharged due to current leakage. When the power-gating switch 610 initially connects the circuit 620 to the power rail 230 to power up the circuit 620 to the active state, a large capacitive load is suddenly placed on the power rail 230 due to the capacitors in the circuit 620. The capacitors in the circuit 620 drain current from the power rail 230 in order to charge up, causing the voltage on the power rail 230 to droop. The PMIC 250 may not be able to supply current fast enough to prevent the droop due the large inductance (e.g., board and/or package inductance) in the lead connecting the PMIC 250 to the power rail 230. Thus, without the DSL 220, a large voltage droop may appear on the power rail 230 when the circuit 620 is initially connected to the power rail 230 after being in the inactive state.

With the DSL 220, when the voltage on the power rail 230 starts drooping, a downward voltage slope appears on the power rail 230, which is detected by the DSL 220. When the magnitude of the downward voltage slope crosses the slope threshold of the DSL 220, the DSL 220 turns on allowing the on-chip capacitor 215 to source current to the circuit 620 through the DSL 220, which reduces the voltage droop, as discussed above. The on-chip capacitor 215 is able to source current to the circuit 620 much faster than the PMIC 250 to reduce the droop. This is because the path between the on-chip capacitor 215 and the circuit 620 through the DSL 220 has a much smaller inductance than the lead connecting the PMIC 250 to the power rail 230. Both the on-chip capacitor 215 and the circuit 620 are located on the chip 200. As a result, the path between them is much shorter (and therefore has less inductance) than the lead connecting the power rail 230 to the PMIC 250, which is located off-chip. Further, sourcing current from the on-chip capacitor 215 to the circuit 620 reduces the current change in the inductance in the lead connecting the power rail 230 to the PMIC 250, thereby reducing noise induced by the inductance.

Figure 7:
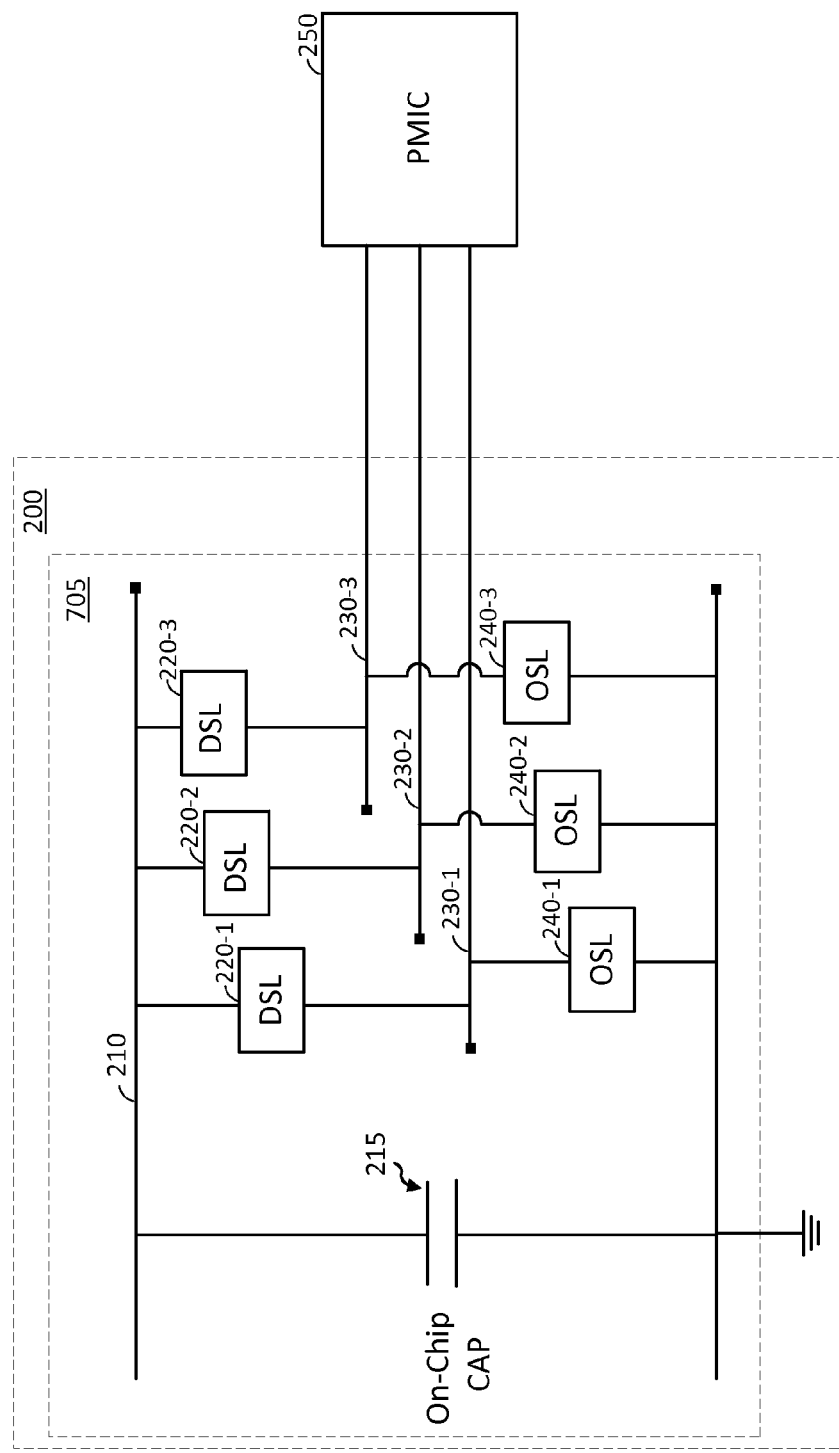
FIG. 7 shows an example of a PDN conditioner comprising a separate DSL and a separate OSL for each one of a plurality of power rails according to an embodiment of the present disclosure.

Although the example in FIG. 2 shows one power rail 230, it is to be appreciated that, since the on-chip capacitor 215 has a large active charge, the on-chip capacitor 215 may be shared by multiple power rails in the SoC. In this regard, FIG. 7 shows an example of a PDN conditioner 705 comprising a plurality of power rails 230-1 to 230-3. The power rails 230-1 to 230-3 are coupled to the PMIC 250, and may receive the same supply voltage from the PMIC 250 or different supply voltages from the PMIC 250. In either case, the supply voltage for each power rail 230-1 to 230-3 is lower than the voltage of the high-voltage rail 210.

The PDN conditioner 705 also comprises a separate DSL 220-1 to 220-3 for each power rail 230-1 to 230-3, and a separate OSL 240-1 to 240-3 for each power rail 230-1 to 230-3. Each DSL 220-1 to 220-3 is coupled between the high-voltage rail 210 and the respective power rail 230-1 to 230-3, and each OSL 240-1 to 240-3 is coupled between the respective power rail 230-1 to 230-3 and ground. Each DSL 220-1 to 220-3 is configured to reduce a voltage droop of a ripple (and hence the amplitude of the ripple) on the respective power rail 230-1 to 230-3 by limiting the downward voltage slope on the respective power rail 230-1 to 230-3, as discussed above. Similarly, each OSL 240-1 to 240-3 is configured to reduce a voltage overshoot of a ripple (and hence the amplitude of the ripple) on the respective power rail 230-1 to 230-3 by limiting the upward voltage slope on the respective power rail 230-1 to 230-3, as discussed above.

Figure 8:
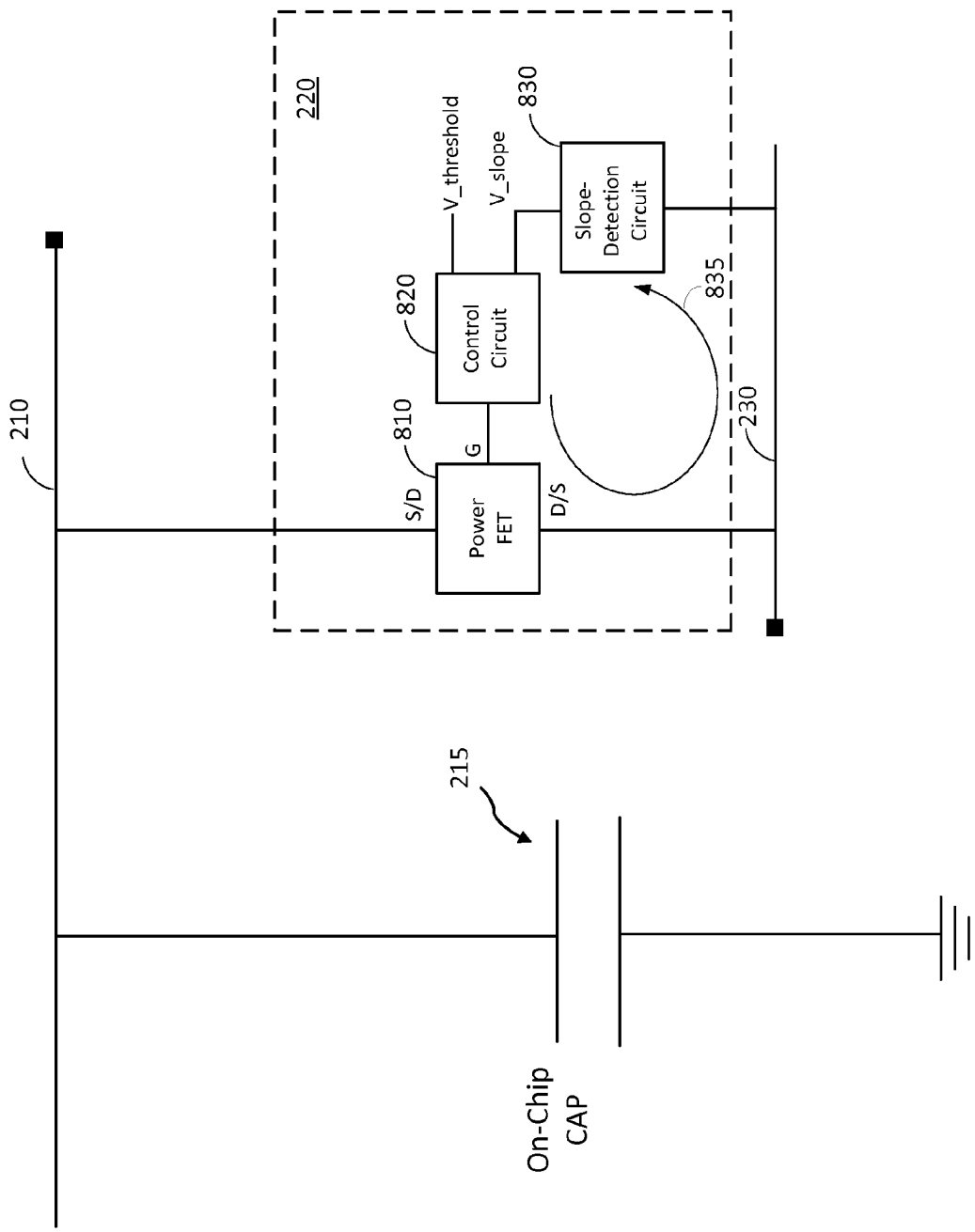
FIG. 8 shows an implementation of the DSL according to an embodiment of the present disclosure.

FIG. 8 shows an exemplary implementation of the DSL 220 according to an embodiment of the present disclosure. For ease of illustration, the OSL 240 is not shown in FIG. 8. In this embodiment, the DSL 220 comprises a power field effect transistor (FET) 810, a control circuit 820, and a slope-detection circuit 830. The power FET 810 may be a P-type FET (PFET) or an N-type FET (NFET). The source and drain of the power FET 810 are coupled between the high-voltage rail 210 and the power rail 230. For example, if the power FET 810 is a PEFT, then the source of the power FET 810 is coupled to the high-voltage rail 210 and the drain of the power FET 810 is coupled to the power rail 230. The gate of power FET 810 is coupled to the control circuit 820. As discussed further below, the control circuit 820 controls the conductivity between the source and drain of the power FET 810 (and hence the current flow from the high-voltage rail 210 to the power rail 230) by controlling the gate voltage of the power FET 810.

The slope-detection circuit 830 is coupled to the power rail 230, and configured to detect a downward (negative) voltage slope on the power rail 230. For example, the slope-detection circuit 830 may detect a downward voltage slope by detecting a time rate of change of voltage (i.e., ΔdV/ΔdT) on the power rail 230 that is negative. The slope-detection circuit 830 may output a voltage (denoted V_slope) that is proportional to the magnitude of the detected downward voltage slope to the control circuit 820.

The control circuit 820 compares the voltage (V_slope) from the slope-detection circuit 830 with a slope-threshold voltage (denoted V_threshold) that is set according to a desired downward voltage slope. If V_slope is below V_threshold, then the control circuit 820 turns off the power FET 810. For the example in which the power FET 810 is a PFET, the control circuit 820 may turn off the power FET 810 by outputting a gate voltage that is approximately equal to the voltage of the high-voltage rail 210.

If V_slope exceeds V_threshold, then the control circuit 820 may turn on the power FET 810 and adjust the gate voltage of the power FET 810 in a direction that reduces the voltage difference between V_slope and V_threshold. For example, the control circuit 820 may reduce the voltage difference by adjusting the gate voltage of the power FET 810 in a direction that increases the conductivity of the power FET 810. The increased conductivity allows more current to flow from the on-chip capacitor 215 to the power rail 230 through the power FET 810, which reduces the downward voltage slope on the power rail 230, and therefore reduces the voltage difference between V_slope and V_threshold. Thus, the control circuit 820 employs negative feedback to limit the downward voltage slope on the power rail 230 to a value set by V_threshold. In FIG. 8, the negative feedback is indicated by negative feedback loop 835. When V_slope falls below V_threshold, the control circuit 820 may turn the power FET 810 back off.

Figure 9:
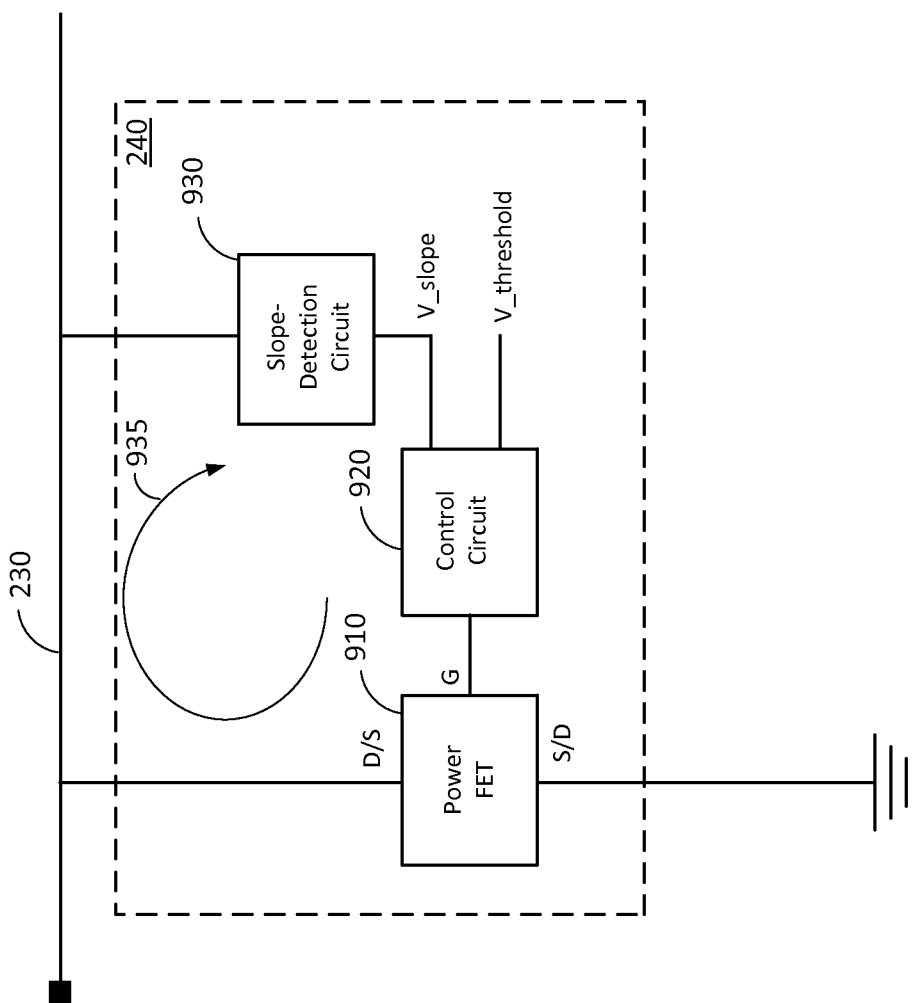
FIG. 9 shows an implementation of the OSL according to an embodiment of the present disclosure.

FIG. 9 shows an exemplary implementation of the OSL 240 according to an embodiment of the present disclosure. For ease of illustration, the DSL 220 is not shown in FIG. 9. In this embodiment, the OSL 240 comprises a power FET 910, a control circuit 920, and a slope-detection circuit 930. The power FET 910 may be a P-type FET (PFET) or an N-type FET (NFET). The drain and source of the power FET 910 are coupled between the power rail 230 and ground. For example, if the power FET 910 is an NEFT, then the drain of the power FET 910 is coupled to the power rail 230 and the source of the power FET 910 is coupled to ground. The gate of the power FET 910 is coupled to the control circuit 920.

The slope-detection circuit 930 is coupled to the power rail 230, and configured to detect an upward (positive) voltage slope on the power rail 230. For example, the slope-detection circuit 930 may detect an upward voltage slope by detecting a time rate of change of voltage (i.e., ΔdV/ΔdT) on the power rail 230 that is positive. The slope-detection circuit 930 may output a voltage (denoted V_slope) that is proportional to the detected upward voltage slope to the control circuit 920.

The control circuit 920 compares the voltage (V_slope) from the slope-detection circuit 930 with a slope-threshold voltage (denoted V_threshold) that is set according to a desired upward voltage slope. If V_slope is below V_threshold, then the control circuit 920 turns off the power FET 910. For the example in which the power FET 910 is an NFET, the control circuit 920 may turn off the power FET 910 by grounding the gate of the power FET 910.

If V_slope exceeds V_threshold, then the control circuit 920 may turn on the power FET 910 and adjust the gate voltage of the power FET 910 in a direction that reduces the voltage difference between V_slope and V_threshold. For example, the control circuit 920 may reduce the voltage difference by adjusting the gate voltage of the power FET 910 in a direction that increases the conductivity of the power FET 910. The increased conductivity allows more current to flow from the power rail 230 to ground through the power FET 910, which reduces the upward voltage slope on the power rail 230, and therefore reduces the voltage difference between V_slope and V_threshold. Thus, the control circuit 920 employs negative feedback to limit the upward voltage slope on the power rail 230 to a value set by V_threshold. In FIG. 9, the negative feedback is indicated by negative feedback loop 935. When V_slope falls below V_threshold, the control circuit 920 may turn the power FET 910 back off.

Figure 10:
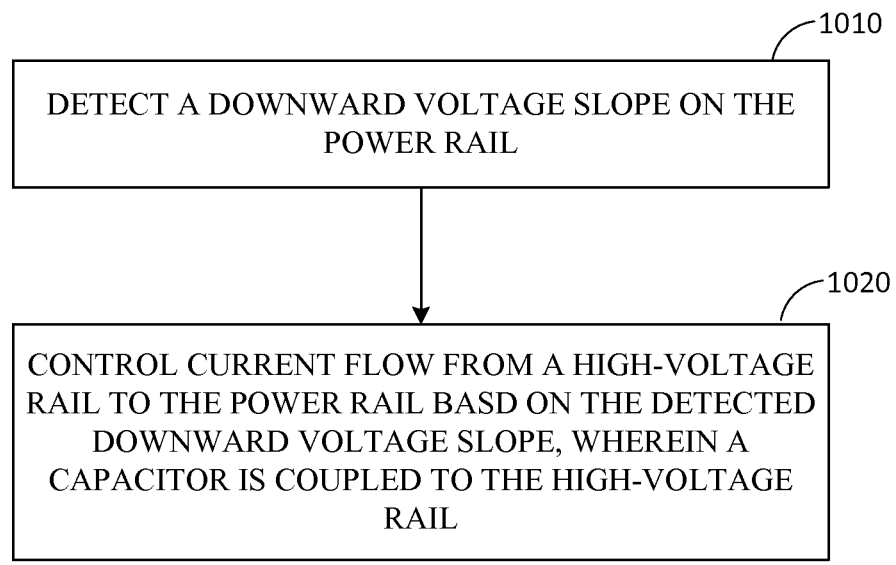
FIG. 10 is a flow diagram of a method for conditioning a power rail according to an embodiment of the present disclosure.

FIG. 10 shows a method 1000 for conditioning a power rail 230. For example, the method may condition the power rail 230 by reducing voltage droops and/or voltage overshoots on the power rail 230.

In step 1010, a downward voltage slope is detected on the power rail. For example, the downward (negative) voltage slope may be detected by a slope-detection circuit (e.g., slope-detection circuit 830) coupled to the power rail (e.g., power rail 230).

In step 1020, current flow is controlled from a high-voltage rail to the power rail based on the detected downward voltage slope, wherein a capacitor is coupled to the high-voltage rail. For example, the current flow may be controlled by adjusting a gate voltage of a power FET (e.g., power FET 810) based on the detected downward voltage slope.

Those skilled in the art will appreciate that the circuits described herein may be realized using a variety of transistor types, and are therefore not limited to field effect transistors. For example, transistor types such as bipolar junction transistors, junction field effect transistor or any other transistor type may be used in place of the power FET 810. For the example of a bipolar junction transistor, the collector and emitter of the bipolar transistor may be coupled between the high-voltage rail 210 and the power rail 230. In this example, the control circuit 820 may control the conductivity of the bipolar junction transistor (and hence the current flow from the on-chip capacitor 215 to the power rail 210)

by controlling the base current of the bipolar junction transistor. Those skilled in the art will also appreciate that the circuits described herein may be fabricated with various IC process technologies such as CMOS, bipolar junction transistor (BJT), bipolar-CMOS (BiCMOS), silicon germanium (SiGe), gallium arsenide (GaAs), etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A power circuit, comprising:
   a capacitor coupled to a high-voltage rail; and
   a droop slope limiter (DSL) coupled between the high-voltage rail and a power rail, wherein the DSL comprises:
      a slope-detection circuit configured to detect a downward voltage slope on the power rail, and to output a slope signal based on the detected downward voltage slope;
      a power transistor coupled between the high-voltage rail and the power rail; and
      a control circuit configured to compare the slope signal from the slope-detection circuit with a slope-threshold signal, to turn on the power transistor if the slope signal is above the slope-threshold signal to allow current flow from the capacitor to the power rail, and to turn off the power transistor if the slope signal is below the slope-threshold signal to block the current flow from the capacitor to the power rail.

2. The power circuit of claim 1, wherein the high-voltage rail is at a voltage that is at least 50 percent greater than the power rail.

3. The power circuit of claim 1, wherein, during a time that the power transistor is turned on, the control circuit is configured to control the current flow through the power transistor such that a magnitude of the detected downward voltage slope is approximately limited to a slope threshold.

4. The power circuit of claim 1, wherein the power transistor comprises a field effect transistor (FET), and the control circuit is configured to turn the power transistor on and off by controlling a gate voltage of the power transistor.

5. The power circuit of claim 1, further comprising an overshoot slope limiter (OSL) coupled between the power rail and a ground, wherein the OSL is configured to detect an upward voltage slope on the power rail, and to control current flow from the power rail to the ground through the OSL based on the detected upward voltage slope.

6. The power circuit of claim 5, wherein the OSL is configured to control the current flow from the power rail to the ground by blocking the current flow from the power rail to the ground if the detected upward voltage slope is below a slope threshold, and allowing the current flow from the power rail to the ground if the detected upward voltage slope exceeds the slope threshold.

7. The power circuit of claim 6, wherein, during a time that the OSL allows the current flow from the power rail to the ground, the OSL is configured to control the current flow from the power rail to the ground through the OSL such that the detected upward voltage slope is approximately limited to the slope threshold.

8. The power circuit of claim 1, wherein the power circuit is integrated on a single chip.

9. The power circuit of claim 8, further comprising a head switch coupled between the power rail and a circuit on the chip, wherein the head switch is configured to power gate the circuit on the chip.

10. A method for conditioning a power rail, comprising:
    detecting a downward voltage slope on the power rail; and
    controlling current flow from a capacitor to the power rail via a high-voltage rail based on the detected downward voltage slope, wherein controlling the current flow further comprises:
       blocking the current flow from the capacitor to the power rail if a magnitude of the detected downward voltage slope is below a slope threshold; and
       allowing the current flow from the capacitor to the power rail if the magnitude of the detected downward voltage slope exceeds the slope threshold.

11. The method of claim 10, wherein the high-voltage rail is at a voltage that is at least 50 percent greater than the power rail.

12. The method of claim 10, wherein allowing the current flow further comprises adjusting the current flow such that the magnitude of the detected downward voltage slope is approximately limited to the slope threshold.

13. The method of claim 12, wherein a field effect transistor (FET) is coupled between the high-voltage rail and the power rail, and adjusting the current flow comprises adjusting a gate voltage of the FET.

14. The method of claim 10, further comprising:
    detecting an upward voltage slope on the power rail; and
    controlling current flow from the power rail to a ground based on the detected upward voltage slope.

15. The method of claim 14, wherein controlling the current flow from the power rail to the ground further comprises:
    blocking the current flow from the power rail to the ground if the detected upward voltage slope is below a slope threshold; and
    allowing the current flow from the power rail to the ground if the detected upward voltage slope exceeds the slope threshold.

16. The method of claim 15, wherein allowing the current flow from the power rail to the ground further comprises adjusting the current flow from the power rail to the ground such that the detected upward voltage slope is approximately limited to the slope threshold.

17. The method of claim 10, wherein the detecting and the controlling are performed on a single chip.

18. An apparatus for conditioning a power rail, comprising:
    means for detecting a downward voltage slope on the power rail; and
    means for controlling current flow from a capacitor to the power rail via a high-voltage rail based on the detected downward voltage slope, wherein the means for controlling the current flow further comprises:
       means for blocking the current flow from the capacitor to the power rail if a magnitude of the detected downward voltage slope is below a slope threshold; and
       means for allowing the current flow from the capacitor to the power rail if the magnitude of the detected downward voltage slope exceeds the slope threshold.

19. The apparatus of claim 18, wherein the high-voltage rail is at a voltage that is at least 50 percent greater than the power rail.

20. The apparatus of claim 18, wherein the means for allowing the current flow further comprises means for adjusting the current flow such that the magnitude of the detected downward voltage slope is approximately limited to the slope threshold.

21. The apparatus of claim 20, wherein a field effect transistor (FET) is coupled between the high-voltage rail and the power rail, and the means for adjusting the current flow comprises means for adjusting a gate voltage of the FET.

22. The apparatus of claim 18, further comprising:
means for detecting an upward voltage slope on the power rail; and
means for controlling current flow from the power rail to a ground based on the detected upward voltage slope.

23. The apparatus of claim 22, wherein the means for controlling the current flow from the power rail to the ground further comprises:
means for blocking the current flow from the power rail to the ground if the detected upward voltage slope is below a slope threshold; and
means for allowing the current flow from the power rail to the ground if the detected upward voltage slope exceeds the slope threshold.

24. The apparatus of claim 23, wherein the means for allowing the current flow from the power rail to the ground further comprises means for adjusting the current flow from the power rail to the ground such that the detected upward voltage slope is approximately limited to the slope threshold.

25. The apparatus of claim 18, wherein the apparatus is integrated on a single chip.

26. The apparatus of claim 25, further comprising a means for power gating a circuit on the chip, wherein the means for power gating is coupled between the power rail and the circuit on the chip.

27. The power circuit of claim 1, further comprising a power management integrated circuit (PMIC) connected to the power rail, wherein the PMIC is configured to provide a supply voltage on the power rail when the DSL blocks the current flow from the capacitor to the power rail.

28. The power circuit of claim 27, wherein the high-voltage rail is at a voltage that is at least 50 percent greater than the supply voltage provided by the PMIC.

* * * * *